United States Patent
Guenther et al.

(10) Patent No.: US 11,682,120 B2
(45) Date of Patent: Jun. 20, 2023

(54) METHOD AND SIGNAL PROCESSING CIRCUIT FOR DETERMINING A SIGNAL HISTOGRAM

(71) Applicant: Rohde & Schwarz GmbH & Co. KG, Munich (DE)

(72) Inventors: Thomas Guenther, Munich (DE); Michael Boehme, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 283 days.

(21) Appl. No.: 17/194,692

(22) Filed: Mar. 8, 2021

(65) Prior Publication Data
US 2022/0284587 A1 Sep. 8, 2022

(51) Int. Cl.
*G06T 7/136* (2017.01)
*G06T 7/11* (2017.01)

(52) U.S. Cl.
CPC .............. *G06T 7/136* (2017.01); *G06T 7/11* (2017.01)

(58) Field of Classification Search
CPC ................................. G06T 7/136; G06T 7/11
USPC ......................................................... 382/172
See application file for complete search history.

(56) References Cited

U.S. PATENT DOCUMENTS

| | | | | |
|---|---|---|---|---|
| 5,848,183 A * | 12/1998 | Farrell | ................... | G06T 7/136 |
| | | | | 382/172 |
| 7,589,728 B2 * | 9/2009 | Ritter | ................... | G01R 13/02 |
| | | | | 345/440.1 |
| 11,532,150 B1 * | 12/2022 | Tohlen | ................. | G06V 10/758 |
| 11,567,006 B2 * | 1/2023 | Rothberg | ............ | H05B 45/335 |
| 2018/0083656 A1 * | 3/2018 | Ray | ..................... | H04B 1/1638 |
| 2019/0064224 A1 | 2/2019 | Guenther | | |

* cited by examiner

*Primary Examiner* — Gabriel I Garcia
(74) *Attorney, Agent, or Firm* — Christensen O'Connor Johnson Kindness PLLC

(57) ABSTRACT

A method of determining a signal histogram having a predetermined number of bins. The method includes: receiving an input signal; decimating the input signal, thereby generating a decimated signal that includes a maximum signal value and a minimum signal value associated with the maximum signal value; assigning the maximum signal value to a maximum bin of a signal histogram; assigning the minimum signal value to a minimum bin of the signal histogram; and filling at least one intermediate bin of the signal histogram with an intermediate value, wherein the intermediate bin is located between the minimum bin and the maximum bin in the signal histogram.

18 Claims, 2 Drawing Sheets

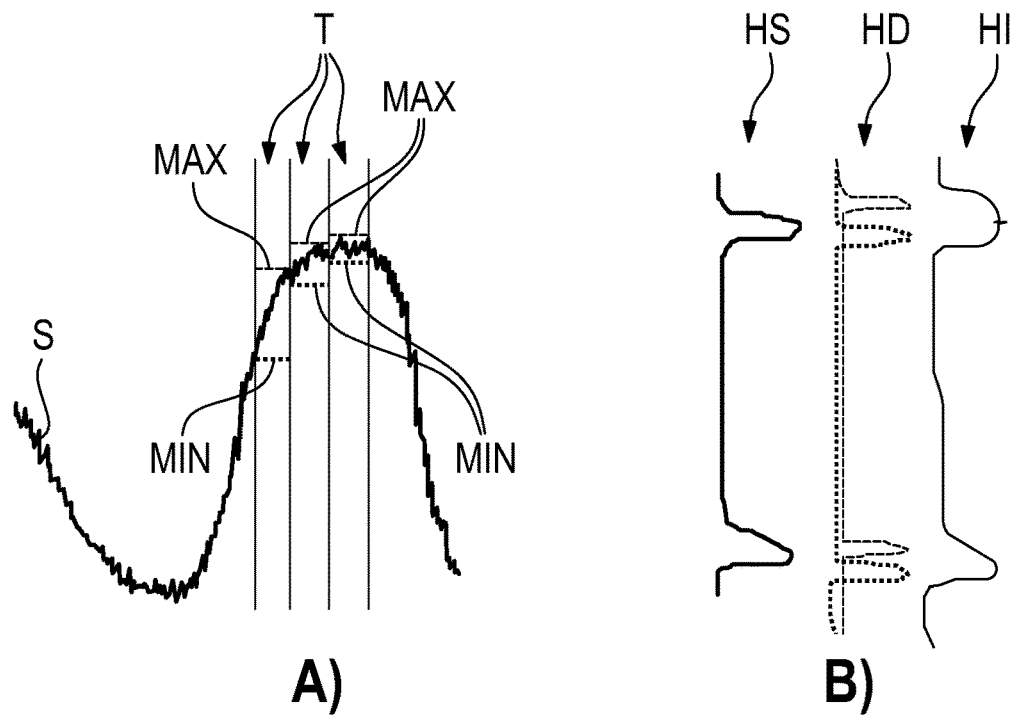
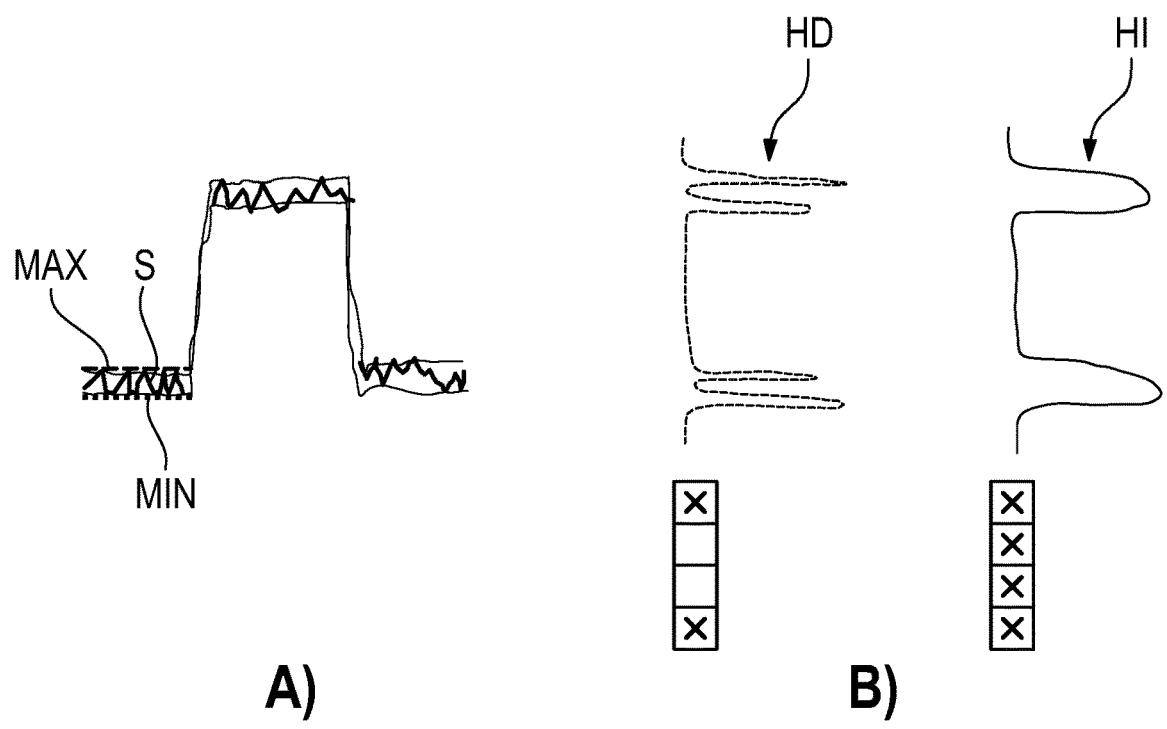
Fig. 3
Fig. 4

METHOD AND SIGNAL PROCESSING CIRCUIT FOR DETERMINING A SIGNAL HISTOGRAM

FIELD OF THE DISCLOSURE

Embodiment of the present disclosure relate generally to a method of determining a signal histogram having a predetermined number of bins. Further, embodiments of the present disclosure generally relate to a signal processing circuit for determining a signal histogram having a predetermined number of bins.

BACKGROUND

In the state of the art, several different methods are known that are used to determine a signal histogram in order to provide information with regard to the characteristics of an input signal processed accordingly. In general, a histogram relates to an approximate representation of the distribution of numerical data. For this purpose, the respective data or rather the range of values is binned. Hence, the entire range of values is divided into a series of intervals. Then, it is counted how many values fall into each interval, e.g. each bin. Accordingly, a signal histogram concerns a histogram that deals with signal values gathered from a signal.

For determining a signal histogram, a so-called peak detection approach is known in order to find minimum/maximum peaks in a signal processed. Accordingly, an input signal to be analyzed is processed, thereby obtaining a maximum signal value as well as a minimum signal value within a certain period of the input signal, which together establish a pair of peak values. The respective peak values are assumed to be constant over the respective time period such that two constant lines are obtained for the respective period of the input signal, particularly the processed signal, irrespective of a values range between the peak values. In the signal histogram obtained, the respective sample associated with the minimum signal value and the maximum signal value is illustrated by two separate areas that may also represent two separate samples, as the values range between the minimum signal value and the maximum signal value is not taken into account for determining the signal histogram. Accordingly, information of the input signal is lost that concerns the values range between the peak values when processing the input signal as described above and generating the signal histogram based thereon. In other words, any signal values located between the maximum signal value and the minimum signal value are cut off when determining the signal histogram.

Accordingly there is need for an improved possibility to determine a signal histogram.

SUMMARY

Embodiments of the present disclosure provide a method of determining a signal histogram having a predetermined number of bins. In an embodiment, the method comprises the steps of:
  receiving an input signal;
  decimating the input signal, thereby generating a decimated signal that comprises a maximum signal value and a minimum signal value associated with the maximum signal value;
  assigning the maximum signal value to a first bin of a signal histogram;

assigning the minimum signal value to a second bin of a signal histogram, wherein the second bin is different to the first bin; and
  filling at least one intermediate bin of the signal histogram with an intermediate value wherein the intermediate bin is located between the first bin and the second bin in the signal histogram.

Further, embodiments of the present disclosure provide a signal processing circuit for determining a signal histogram having a predetermined number of bins. In an embodiment, the signal processing circuit comprises an input for receiving an input signal. Further, the signal processing circuit comprises a decimator circuit that decimates the input signal, thereby generating a decimated signal that comprises a maximum signal value and a minimum signal value associated with a maximum signal value. In addition, the signal processing circuit comprises a calculation circuit that assigns a maximum signal value to a first bin of a histogram, wherein the calculation circuit also assigns the minimum signal value to a second bin of the signal histogram. Moreover, the calculation circuit fills at least one intermediate bin of the signal histogram with an intermediate value, wherein the intermediate bin is located between the first bin and the second bin in the signal histogram.

Accordingly, the signal histogram determined by embodiments of the method and the signal processing circuit also takes the values range between the maximum signal value and the minimum signal value into account while also considering the maximum signal value and the minimum signal value. Hence, the band of the input signal between the maximum signal value and the minimum signal value is considered such that the histogram is not based solely on the extreme values, e.g. the peak values associated with the maximum signal value and the minimum signal value.

In general, the maximum signal value and the minimum signal value are obtained by determining the maximum signal value and the minimum signal value of the input signal while taking a certain portion of the input signal into account. Accordingly, the maximum signal value and the minimum signal value are linked with each other, as they relate to the same portion of the input signal. Thus, the minimum signal value is associated with the maximum signal value. However, the input signal varies between these peak values, namely the maximum signal value and the minimum signal value, within the portion of the input signal. Accordingly, the intermediate value is provided that represents the behavior of the input signal between the peak values. This intermediate value representing the behavior of the input signal between the peak values, namely the maximum signal value and the minimum signal value, is used for filling the intermediate bin that is located between the first bin and the second bin in the signal histogram. Accordingly, it becomes obvious that the intermediate value representing the values range between the peak values has a figure or rather magnitude that is between the ones of the maximum signal value and the minimum signal value.

An aspect provides that at least one decimated sample is obtained when decimating the input signal, which is associated with the minimum signal value and the maximum value. When processing the input signal, e.g. decimating the input signal, several decimated samples are provided. Each decimated sample is associated with the respective signal portion having a maximum signal value and a minimum signal value. Put differently, the input signal is divided into a series of intervals, wherein each interval is associated with a corresponding decimated sample. Thus, for each decimated sample of the input signal, for example the decimated signal, a respective minimum signal value as well as a maximum signal value are determined, which are used for determining the signal histogram. The respective portion or rather interval of the input signal corresponds to a certain time period of the input signal, wherein the input signal within this time period is reduced to the respective maximum signal value and the respective minimum signal value when decimating the input signal. Hence, the time period is associated with the decimated sample such that each decimated sample comprises at least two different values, namely the minimum signal value and the maximum signal value.

Besides the peak values mentioned above, the respective intermediate value is also associated with each decimated sample such that three different values are provided for each decimated sample based on which the signal histogram is determined. However, the intermediate value may be determined in a post-processing step, e.g. after decimating the input signal.

As mentioned above, three different values per decimated sample may be taken into account for determining the signal histogram having the predetermined number of bins. Hence, the signal histogram is generated or rather determined once the input signal has been decimated and the intermediate value was determined. This ensures a more realistic reproduction of the input signal due to the additional information associated with the values range between the peak values, namely the at least one intermediate value, that is taken into consideration for determining the signal histogram.

Another aspect provides that a values range between the minimum signal value and the maximum signal value is taken into account for determining the signal histogram having the predetermined number of bins. As discussed above, the intermediate value is located in the values range between the minimum signal value and the maximum signal value such that the values range between the peak values is also used for determining the signal histogram. Since the input signal is analyzed over a certain time period when decimating the input signal, the respective values associated with the values range during that time period are considered as well.

For instance, the intermediate value is calculated based on the input signal. Thus, the intermediate value is an artificially determined value, as it is not directly obtained/measured from the input signal, but calculated, e.g. during a post-processing. The intermediate value may be calculated by the calculation circuit.

In some embodiments, the intermediate value is calculated based on the minimum signal value and the maximum signal value. The respective figure/magnitude of the intermediate signal value depends on the respective figures/magnitudes of the minimum signal value and the maximum signal value. For instance, the intermediate value may relate to the mean value of the minimum signal value and the maximum signal value. Further, the intermediate value, for example its figure/magnitude, may depend on the range between the minimum signal value and the maximum signal value. Thus, a larger range may result in a different intermediate value compared to a smaller range even though the respective mean value is the same.

Another aspect provides that the weighting factor is assigned to the intermediate value. Therefore, the respective figure/magnitude of the intermediate value may be weighted according to a certain ruling. For instance, the intermediate value is determined based on 70% of the maximum signal value and 30% of the minimum signal value.

For instance, the weighting factor depends on the range between the minimum signal value and the maximum signal value. Thus, a smaller weighting factor is provided for a large range, whereas a higher weighting factor is provided for a small range between the peak values. The weighting factor applied may be selected from a group of weighting factors or rather rulings for the weighting factor. Hence, a first weighting factor or rather ruling is used in case that the range between the minimum signal value and the maximum signal value is smaller than a threshold value for the range. A second weighting factor or rather ruling is used in case that the range between the minimum signal value and the maximum signal value is higher than the threshold value.

Several successive decimated samples together may form a sample, e.g. in case the peak values of the successive decimated samples do not vary significantly.

Due to the additional intermediate value taken into account for determining the signal histogram, each sample is associated with a range instead of two singular or rather separate peaks, thereby providing more information concerning the input signal.

According to an embodiment, the intermediate value is determined linearly between the minimum signal value and the maximum signal value. The linearity may be provided for successive intermediate values.

According to another embodiment, the intermediate value is determined according to a Gaussian distribution between the minimum signal value and the maximum signal value. Hence, the intermediate values of successive intermediate values may follow a Gaussian distribution.

Another embodiment provides that the intermediate value is determined according to a triangle distribution between the minimum signal value and the maximum signal value. Hence, the respective intermediate values of successive intermediate values may be distributed according to a triangle distribution.

In general, the respective intermediate values for several samples may be calculated in a post-processing such that the respective intermediate values are inserted in a post-processing step.

Accordingly, the values can be determined in a linear manner, a Gaussian manner, a triangular manner or any other intended manner.

Further, the input signal may be analyzed, thereby determining at least one of the maximum signal value and the minimum signal value. Thus, the input signal is analyzed by the signal processing circuit in order to identify the maximum signal value and the minimum signal value, thereby decimating the input signal in order to determine the decimated signal.

In some embodiments, the input signal may be analyzed section by section over time, thereby determining at least one of the maximum signal value and the minimum signal value. As mentioned above, the input signal is decimated by reducing the amount of data, as the number of samples is reduced. In some embodiments, the input signal is split or rather divided into sections with regard to the time, wherein each section is associated with a corresponding decimated sample. Each decimated sample is associated with the maximum signal value and the minimum signal value.

Another aspect provides that at least one of the maximum signal value and the minimum signal value is determined for a predetermined time span of the input signal. The time span or rather time period is associated with the decimated sample. In some embodiments, the time span or rather time period correspond to the section of the input signal.

Further, each bin of the signal histogram may be assigned to a dedicated value range of the signal values of the input signal. Thus, each bin may comprise a certain value range such that signal values forwarding within the respective value range are dedicated to a respective bin.

A further aspect provides that the input signal is measured directly, thereby receiving the input signal. For instance, a measurement probe or rather measurement instrument is provided that measures the input signal which is processed directly in order to determine the signal histogram. Hence, the input signal is directly obtained, namely in a live manner.

Alternatively, the input signal may be obtained from a memory, thereby receiving the input signal. Hence, the input signal or rather data associated with the input signal may be stored in the memory that is accessed for analyzing purposes. Furthermore, the input signal stored in the memory may be replayed for analyzing purposes.

Generally, the first bin of the signal histogram may also be called maximum bin, as it is filled with the data associated with the maximum signal value of the respective decimated sample. Thus, the second bin of the signal histogram may also be called minimum bin, as it is filled with the data associated with the minimum signal value of the respective decimated sample.

In some embodiments, the signal histogram may comprise several first/maximum bins, several second/minimum bins as well as several intermediate bins. Each decimated sample is associated with one first/maximum bin and one second/minimum bin.

DESCRIPTION OF THE DRAWINGS

The foregoing aspects and many of the attendant advantages of the claimed subject matter will become more readily appreciated as the same become better understood by reference to the following detailed description, when taken in conjunction with the accompanying drawings, wherein:

FIG. 3 schematically shows an overview that illustrates a sinusoidal signal processed and a comparison of a signal histogram of a non-decimated signal, a signal histogram obtained by the method according to the present disclosure and a signal histogram obtained in the prior art; and FIG. 4 schematically shows an overview that illustrates a rectangular signal processed and a comparison of a signal histogram obtained by the method according to an embodiment of the present disclosure with a signal histogram obtained from a method according to the prior art.

DETAILED DESCRIPTION

The detailed description set forth below in connection with the appended drawings, where like numerals reference like elements, is intended as a description of various embodiments of the disclosed subject matter and is not intended to represent the only embodiments. Each embodiment described in this disclosure is provided merely as an example or illustration and should not be construed as preferred or advantageous over other embodiments. The illustrative examples provided herein are not intended to be exhaustive or to limit the claimed subject matter to the precise forms disclosed.

Figure 1:
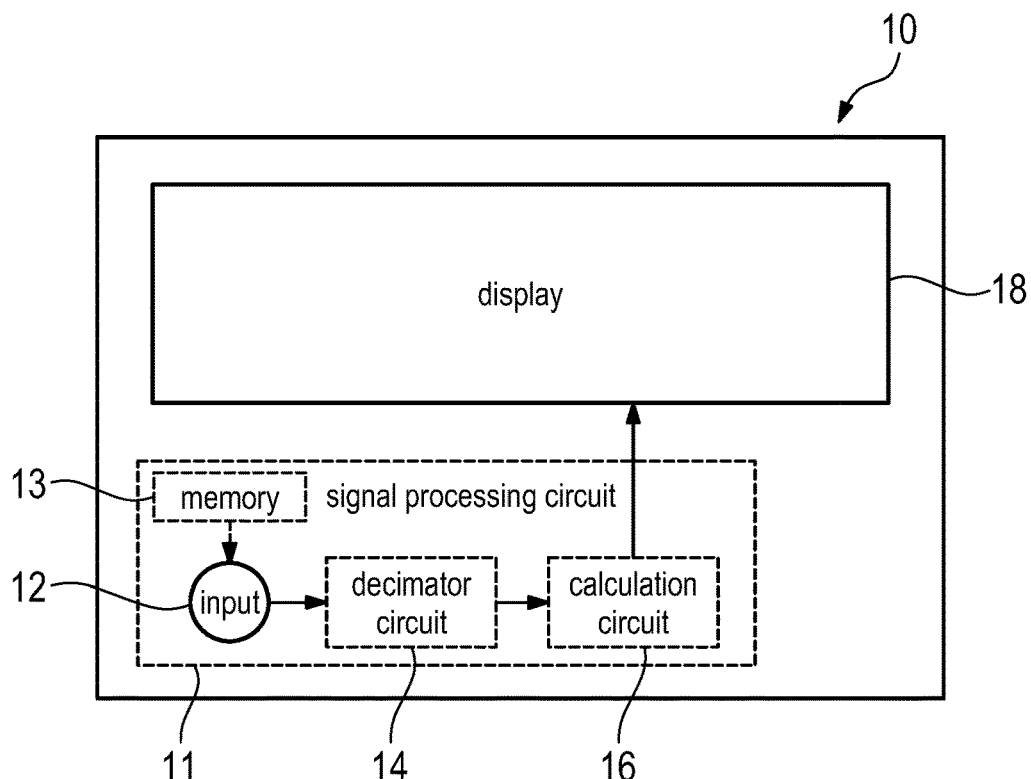
FIG. 1 schematically shows a signal processing circuit according to an embodiment of the present disclosure.

In FIG. 1, a test and measurement device 10 is shown, which has a signal processing circuit 11 that is used for determining a signal histogram having a predetermined number of bins. The test and measurement device 10, for example the signal processing circuit 11, comprises an input 12 that is configured to receive an input signal.

The input signal may be received from a measurement instrument connected with the input 12, for example a measurement probe of an instrument. Hence, the input 12 may be provided at an outer surface of a housing of the test and measurement device 10. Alternatively, the input 12 of the signal processing circuit 10 may be connected with a memory 13 that provides the input signal or rather data associated with the input signal. Accordingly, the input signal may be received in a live manner or rather in a post-processing while accessing the memory 13, e.g. data stored in the memory 13, thereby reading data associated with the input signal from the memory 13.

The input 12 is connected with a decimator circuit 14 of the signal processing circuit 11. The decimator circuit 14 is configured to receive the input signal from the input 12, thereby processing the input signal such that the input signal is decimated. The decimator circuit 14 is configured to generate a decimated signal that comprises a maximum signal value and a minimum signal value that is associated with the maximum signal value.

In other words, the decimator circuit 14 reduces the data associated with the input signal, for example the respective number of samples, as the input signal is split into several portions/sections, wherein each portion/section is associated with a certain time span or rather time period of the input signal. Within each time period or rather time span, the decimator circuit 14 determines a respective maximum signal value and a respective minimum signal value. Therefore, the respective maximum and minimum signal values are associated with each other, as they relate to the same time period or rather time span, namely the same decimated sample. This is schematically illustrated in FIG. 3.

Afterwards, the respective information is forwarded from the decimator circuit 14 to a calculation circuit 16 of the signal processing circuit 11. The calculation circuit 16 is connected with a display 18 that is used for displaying the respective information obtained from the calculation circuit 16 as described hereinafter.

The calculation circuit 16 is configured to assign the maximum signal value obtained from the decimator circuit 14 to a first bin of a signal histogram to be displayed via the display 18. In addition, the calculation circuit 16 is configured to assign the minimum signal value obtained from the decimator circuit 14 to a second bin of the signal histogram to be displayed. Due to the respective information associated with the first and second bins, they may also be called maximum bin and minimum bin, respectively.

In addition, the calculation circuit 16 is configured to calculate with an intermediate value that is based on the input signal, for example based on the minimum signal value and the maximum signal value. In general, values range between the minimum signal value and the maximum signal value is taken into account when calculating the intermediate value.

The calculation circuit 16, which generates the signal histogram, also fills at least one intermediate bin of the signal histogram, namely a bin located between the first bin and the second bin in the signal histogram, with the intermediate value calculated previously.

Accordingly, the signal histogram provides information concerning the peak values per decimated sample, namely the minimum signal value and the maximum signal value, as well as the values range between the minimum signal value and the maximum signal value.

Figure 2:
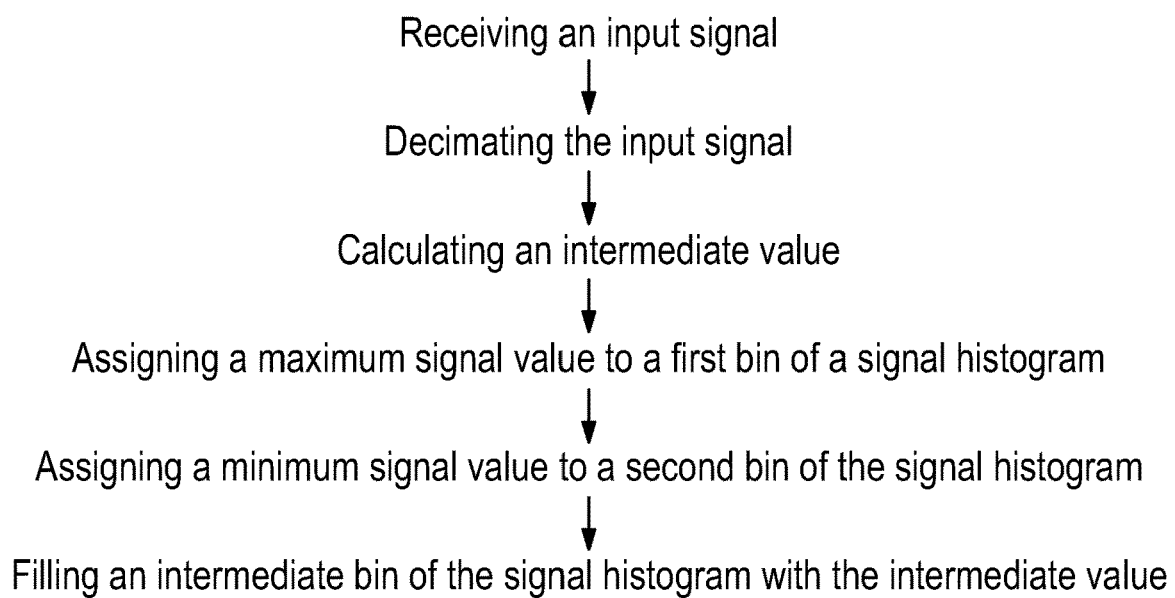
FIG. 2 schematically shows a flow-chart illustrating a method of determining a signal histogram according to an embodiment of the present disclosure.

The respective steps for determining the signal histogram are illustrated in FIG. 2 in a representative manner.

In FIGS. 3 and 4, the respective steps performed are illustrated and the resulting signal histogram is compared with one obtained in the prior art.

In FIG. 3, for example portion A) of FIG. 3, a sinusoidal input signal or rather a sinusoidal signal portion of an input signal is shown, e.g. a rectangular input signal, which is labelled by S. The respective signal S is processed in a sectional manner while decimating the input signal S in time periods T, thereby obtaining decimated samples that comprise a maximum signal value MAX and a minimum signal value MIN. The minimum signal value MIN is associated with the maximum signal value MAX per decimated sample, namely within each time period T.

In FIG. 3, for example portion B of FIG. 3, several histograms are shown. A first signal histogram shown is determined directly from the input signal S. This signal histogram is labelled with HS.

A second signal histogram shown is obtained from the decimated signal, e.g. the maximum signal values MAX and the minimum signal values MIN. This signal histogram is labelled with HD. A comparison of both signal histograms, namely HS and HD, illustrates that information is lost, namely the information concerning the values range between the peak values, e.g. the maximum signal values MAX and the minimum signal values MIN for each decimated sample.

A third signal histogram shown in FIG. 3 is obtained by the method described above, which additionally takes the intermediate value per decimated sample into account. This signal histogram is labelled with HI in FIG. 3.

As mentioned above, the intermediate value is calculated, e.g., in a post-processing step, based on the input signal or rather the maximum signal value MAX and the minimum signal value MIN of each decimated sample. Accordingly, the values range between the minimum signal value and the maximum signal value is taken into account for determining the signal histogram.

Hence, at least three different values per decimated sample are taken into account for determining the signal histogram having the predetermined number of bins.

It should be clear from a comparison of the histograms that the signal histogram obtained by embodiments of the method according to the present disclosure provides a deeper insight, as more information of the input signal is provided.

The signal histogram HI represents the signal histogram HS obtained directly from the input signal in an improved manner compared to the signal histogram HD that has been obtained from the decimated signal, namely the minimum signal values and the maximum signal values.

In methods according to the present disclosure, each decimated sample obtained when decimating the input signal is associated with the minimum signal value, the maximum signal value and additionally the intermediate value, such that three different values per decimated sample are taken into account for determining the signal histogram. Thus, the values range between the peak values is taken into account for determining the signal histogram, thereby providing more information concerning the input signal.

The intermediate value is not gathered when decimating the input signal, but calculated based on the input signal, for example the signal peak values. This is done by the calculation circuit 16.

The intermediate value may be determined based on a weighting factor that takes the input signal into account, for example the minimum signal value and the maximum signal value. For instance, the maximum signal value has a greater influence on the intermediate value (more than 50%) than the minimum signal value (less than 50%) such that the intermediate value is calculated such that it is closer to the maximum signal value.

Further, the weighting factor may depend on the range between the minimum signal value and the maximum signal value for the respective decimated sample. Hence, a different weighting factor is taken into account in case that the range between the minimum signal value and the maximum signal value exceeds a certain threshold. Thus, the respective weighting factor applied depends on the range.

In general, the intermediate values for subsequent decimated samples may be determined in a linear manner, according to a Gaussian distribution or rather according to triangle distribution.

In FIG. 4, another example is shown. The input signal S is analyzed section by section over time, namely for several time periods individually or rather predetermined time spans, thereby decimating the input signal S in order to generate the decimated samples. Hence, the maximum signal value MAX as well as the minimum signal value MIN are determined for each decimated sample. This is illustrated in FIG. 4 by the constant lines.

In case that only these peak values are taken into account, the signal histogram HD would be determined that does not comprise information concerning the values range between the peak values.

However as mentioned above, the calculation circuit 16 calculates the intermediate value that is located between the signal peak values, namely the minimum signal value MIN and the maximum signal value MAX, thereby providing the at least one intermediate value for the values range between the peak values.

This intermediate value is also taken into consideration when determining the signal histogram, thereby arriving at the one labelled with HI in FIG. 4, for example portion B) of FIG. 4.

The respective signal histogram is determined by filling at least one intermediate bin of the signal histogram with the intermediate value calculated for the respective decimated sample. Obviously, the at least one intermediate bin is located between the first bin and the second bin in the signal histogram, namely the bins associated with the minimum signal value MIN and the maximum signal value MAX.

Thus, the values range or rather a corresponding band between the peak values is also taken into account such that the signal histogram obtained provides more information concerning the input signal.

In addition, the respective bins of the signal histogram are associated to a certain value range of the signal values of the input signal, for example the decimated signal. This ensures that a certain bin within the signal histogram covers a certain variety of signal values. A respective value range associated with a single bin may correspond to the resolution of the signal histogram. If required, a very high resolution is provided such that the number of bins of the signal histogram is large.

In any case, the respective histograms provided clearly show that more information concerning the input signal S is obtained by the signal histogram HI determined by the method according to the present disclosure compared to the signal histogram HD obtained by a method according to the prior art.

Therefore, the original waveform of the input signal S can be derived more easily from the signal histogram HI provided.

Certain embodiments disclosed herein utilize circuitry (e.g., one or more circuits) in order to implement standards, protocols, methodologies or technologies disclosed herein, operably couple two or more components, generate information, process information, analyze information, generate signals, encode/decode signals, convert signals, transmit and/or receive signals, control other devices, etc. Circuitry of any type can be used. It will be appreciated that the term "information" can be use synonymously with the term "signals" in this paragraph. It will be further appreciated that the terms "circuitry," "circuit," "one or more circuits," etc., can be used synonymously herein.

In an embodiment, circuitry includes, among other things, one or more computing devices such as a processor (e.g., a microprocessor), a central processing unit (CPU), a digital signal processor (DSP), an application-specific integrated circuit (ASIC), a field-programmable gate array (FPGA), a system on a chip (SoC), or the like, or any combinations thereof, and can include discrete digital or analog circuit elements or electronics, or combinations thereof. In an embodiment, circuitry includes hardware circuit implementations (e.g., implementations in analog circuitry, implementations in digital circuitry, and the like, and combinations thereof).

In an embodiment, circuitry includes combinations of circuits and computer program products having software or firmware instructions stored on one or more computer readable memories that work together to cause a device to perform one or more protocols, methodologies or technologies described herein. In an embodiment, circuitry includes circuits, such as, for example, microprocessors or portions of microprocessor, that require software, firmware, and the like for operation. In an embodiment, circuitry includes one or more processors or portions thereof and accompanying software, firmware, hardware, and the like.

The present application may reference quantities and numbers. Unless specifically stated, such quantities and numbers are not to be considered restrictive, but exemplary of the possible quantities or numbers associated with the present application. Also in this regard, the present application may use the term "plurality" to reference a quantity or number. In this regard, the term "plurality" is meant to be any number that is more than one, for example, two, three, four, five, etc. The terms "about", "approximately", "near" etc., mean plus or minus 5% of the stated value.

In some examples, the functionality described herein can be implemented by special purpose hardware-based computer systems or circuits, etc., or combinations of special purpose hardware and computer instructions.

Of course, in some embodiments, two or more of aforementioned components, or parts thereof, can be integrated or share hardware and/or software, circuitry, etc. In some embodiments, these components, or parts thereof, may be grouped in a single location or distributed over a wide area. In circumstances were the components are distributed, the components are accessible to each other via communication links.

The principles, representative embodiments, and modes of operation of the present disclosure have been described in the foregoing description. However, aspects of the present disclosure which are intended to be protected are not to be construed as limited to the particular embodiments disclosed. Further, the embodiments described herein are to be regarded as illustrative rather than restrictive. It will be appreciated that variations and changes may be made by others, and equivalents employed, without departing from the spirit of the present disclosure. Accordingly, it is expressly intended that all such variations, changes, and equivalents fall within the spirit and scope of the present disclosure, as claimed.

The embodiments of the invention in which an exclusive property or privilege is claimed are defined as follows:

1. A method of determining a signal histogram having a predetermined number of bins, the method comprising:
   receiving an input signal;
   decimating the input signal, thereby generating a decimated signal that comprises a maximum signal value and a minimum signal value associated with the maximum signal value;
   assigning the maximum signal value to a first bin of a signal histogram;
   assigning the minimum signal value to a second bin of the signal histogram, wherein the second bin is different to the first bin; and
   filling at least one intermediate bin of the signal histogram with an intermediate value, wherein the intermediate bin is located between the first bin and the second bin in the signal histogram.

2. The method according to claim 1, wherein at least one decimated sample is obtained when decimating the input signal, which is associated with the minimum signal value and the maximum signal value.

3. The method according to claim 1, wherein at least three different values per decimated sample are taken into account for determining the signal histogram having the predetermined number of bins.

4. The method according to claim 1, wherein a values range between the minimum signal value and the maximum signal value is taken into account for determining the signal histogram having the predetermined number of bins.

5. The method according to claim 1, wherein the intermediate value is calculated based on the input signal.

6. The method according to claim 1, wherein the intermediate value is calculated based on the minimum signal value and the maximum signal value.

7. The method according to claim 1, wherein a weighting factor is assigned to the intermediate value.

8. The method according to claim 7, wherein the weighting factor depends on the range between the minimum signal value and the maximum signal value.

9. The method according to claim 1, wherein the intermediate value is determined linearly between the minimum signal value and the maximum signal value.

10. The method according to claim 1, wherein the intermediate value is determined according to a Gaussian distribution between the minimum signal value and the maximum signal value.

11. The method according to claim 1, wherein the intermediate value is determined according to a triangle distribution between the minimum signal value and the maximum signal value.

12. The method according to claim 1, wherein the input signal is analyzed, thereby determining at least one of the maximum signal value and the minimum signal value.

13. The method according to claim 1, wherein the input signal is analyzed section by section over time, thereby determining at least one of the maximum signal value and the minimum signal value.

14. The method according to claim 1, wherein at least one of the maximum signal value and the minimum signal value is determined for a predetermined time span of the input signal.

15. The method according to claim 1, wherein each bin of the signal histogram is assigned to a dedicated value range of the signal values of the input signal.

16. The method according to claim 1, wherein the input signal is measured directly, thereby receiving the input signal.

17. The method according to claim 1, wherein the input signal is obtained from a memory, thereby receiving the input signal.

18. A signal processing circuit for determining a signal histogram having a predetermined number of bins, wherein the signal processing circuit comprises:
an input for receiving an input signal;
a decimator circuit that decimates the input signal, thereby generating a decimated signal that comprises a maximum signal value and a minimum signal value associated with the maximum signal value; and
a calculation circuit that assigns the maximum signal value to a first bin of a signal histogram, wherein the calculation circuit also assigns the minimum signal value to a second bin of the signal histogram, and wherein the calculation circuit fills at least one intermediate bin of the signal histogram with an intermediate value, wherein the intermediate bin is located between the first bin and the second bin in the signal histogram.

* * * * *